United States Patent
Chandra et al.

[11] Patent Number: 6,009,246
[45] Date of Patent: Dec. 28, 1999

[54] METHOD AND SYSTEM FOR EVALUATING INTRUSIVE REPAIR FOR PLURALITY OF DEVICES

[75] Inventors: Arun Chandra; John Carl Grzinich, both of Austin, Tex.; Manoranjan Kanthanathan, Foster City, Calif.

[73] Assignee: International Business Machines Corporation, Armonk, N.Y.

[21] Appl. No.: 08/783,595

[22] Filed: Jan. 13, 1997

[51] Int. Cl.$^6$ ...................................................... G06F 15/80
[52] U.S. Cl. ................. 395/183.02; 395/182.09; 395/183.21; 364/580; 364/551.01
[58] Field of Search ................. 395/183.13, 183.02, 395/183.21, 183.01, 182.04, 182.09; 371/26, 3; 364/551.01, 580

[56] References Cited

U.S. PATENT DOCUMENTS

| | | | |
|---|---|---|---|
| 4,922,491 | 5/1990 | Coale | 371/16.1 |
| 4,970,725 | 11/1990 | McEnroe et al. | 371/15.1 |
| 5,001,714 | 3/1991 | Stark et al. | 371/26 |
| 5,101,337 | 3/1992 | Ebizuka | 364/184 |
| 5,127,005 | 6/1992 | Oda et al. | 371/15.1 |
| 5,237,518 | 8/1993 | Sztipanovits et al. | 364/551.01 |
| 5,239,487 | 8/1993 | Horejsi et al. | 364/552 |
| 5,253,184 | 10/1993 | Kleinschnitz | 364/550 |
| 5,253,332 | 10/1993 | Kumamoto | 395/51 |
| 5,287,505 | 2/1994 | Calvert et al. | 395/600 |
| 5,351,247 | 9/1994 | Dow et al. | 371/15.1 |
| 5,463,768 | 10/1995 | Cuddihy et al. | 395/183.13 |
| 5,465,321 | 11/1995 | Smyth | 395/22 |
| 5,561,760 | 10/1996 | Ferris et al. | 395/183.01 |
| 5,596,712 | 1/1997 | Tsuyama et al. | 395/183.02 |

*Primary Examiner*—Robert W. Beausoliel, Jr.
*Assistant Examiner*—Ly V. Hua
*Attorney, Agent, or Firm*—Sawyer & Associates; Volel Emile

[57] ABSTRACT

The present invention discloses a system and method to evaluate intrusive repair. The method and system is based on analyzing data from the field and drawing causal diagrams (cause-consequence diagrams). In an aspect of the present invention, a method and system for evaluating intrusive repair for a class of devices comprises providing a threshold time window for analyzing failure data. The system and method further includes utilizing a causal diagram based on the analysis of the failure data for the class of devices to indicate the probability of intrusive repair. In the present invention, two measures are defined to evaluate intrusive repair—intrusivability and one-fixability. Intrusivability is defined as the probability that a repair action will cause a new fault. One-fixability is defined as the probability that the diagnostic process will fix the fault on the first repair attempt. Both of these measures are determined by using the causal diagram in accordance with the present invention.

22 Claims, 5 Drawing Sheets

Customer ID: A20   Site ID: 2ZY

No. of Machines: 5000   Machine Class: 3XX

MACHINE ID: 26

FAILURE DAY: 06/22/95

REPAIR DAY: 06/22/95

REPAIR PARTS: NONE

REPAIR PERSON: John Doe

FAILURE CAUSE: MEMORY

COMMENTS:

( Failure Record )

Customer ID: A20         Site ID: 2ZY

No. of Machines: 5000    Machine Class: 3XX

ONE-FAIL: 30 (I II III II I IV I I IV V V V IV I II
              II II I I V V V IV IV III II III III IV V)

TWO-FAIL: 10 { (I I) (I III) (II IV) (II II) (IV IV)
               (II II) (III III) (III I) (II I) (IV I) }

THREE-FAIL: 5 { (I I I) (III III III) (I II III)
                (IV II I) (IV IV II) }

TRIAL ID: 20

THRESHOLD WINDOW (DAYS): 7

MAX-FAIL: 3

COMMENTS:

( Trial Data )

FIG. 4

TABLE 1 RESULTS

| Machine Class | Intrusivability | One-Fixability | Coeff of Variation |
|---|---|---|---|
| 3XX | 0.19 | 0.78 | 12.3 |
| 3YY | 0.05 | 0.94 | 11.1 |
| 3ZZ | 0.14 | 0.89 | 13.4 |

FIG. 5

METHOD AND SYSTEM FOR EVALUATING INTRUSIVE REPAIR FOR PLURALITY OF DEVICES

TECHNICAL FIELD

The present invention is related to the effects of repairs on a class of devices and more particularly to evaluating intrusive repair on such a class of devices.

BACKGROUND

Repairs do not always fix a problem on the first attempt. This is particularly important when attempting to determine how repair actions effect classes of devices. For example, certain classes of computers may exhibit certain failure characteristics based upon the repair action. If these failure characteristics could be accurately measured, then the class of computers could be more easily maintained over their useful life. In addition, if these failure characteristics could be adequately quantified, the diagnosis of the reasons for failure may be more easily obtained. There are many factors that contribute to inadequate repair actions. Primarily, inadequate diagnostics, low maintainability design, and inadequate repair-person education can be causes of inadequate repair actions. This problem is further compounded if the repair action causes more repair actions independent of the normal failure rate driven faults. This is the phenomena of intrusive repair. Intrusive repair negatively impacts warranty cost and therefore needs to be evaluated. A significant intrusive repair factor indication provides a warning of inadequate maintainability of a machine and provides for justification for better maintainability design, and better education.

Therefore, it is desirable to be able to detect and diagnose failure characteristics in classes of machines. It is important that this detection and diagnosis be relatively simple, cost effective and applicable to existing failure analysis systems and methods. The present invention addresses such a need.

SUMMARY

The present invention discloses a system and method to evaluate intrusive repair. The method and system is based on analyzing data from the field and drawing causal diagrams (cause-consequence diagrams). In an aspect of the present invention, a method and system for evaluating intrusive repair for a class of devices comprises providing a threshold time window for analyzing failure data. The system and method further includes utilizing a causal diagram based on the analysis of the failure data for the class of devices to indicate the probability of intrusive repair.

In the present invention, two measures are defined to evaluate intrusive repair—intrusivability and one-fixability. Intrusivability is defined as the probability that a repair action will cause a new fault. One-fixability is defined as the probability that the diagnostic process will fix the fault on the first repair attempt. Both of these measures are determined by using the causal diagram in accordance with the present invention.

DESCRIPTION OF THE DRAWINGS

FIG. 2 is a failure data record utilized in accordance with the present invention.

FIG. 4 is an example of a trial data record for the causal diagram of FIG. 3.

FIG. 5 is a table of the results of the trial data record of FIG. 4.

DETAILED DESCRIPTION

Figure 1:
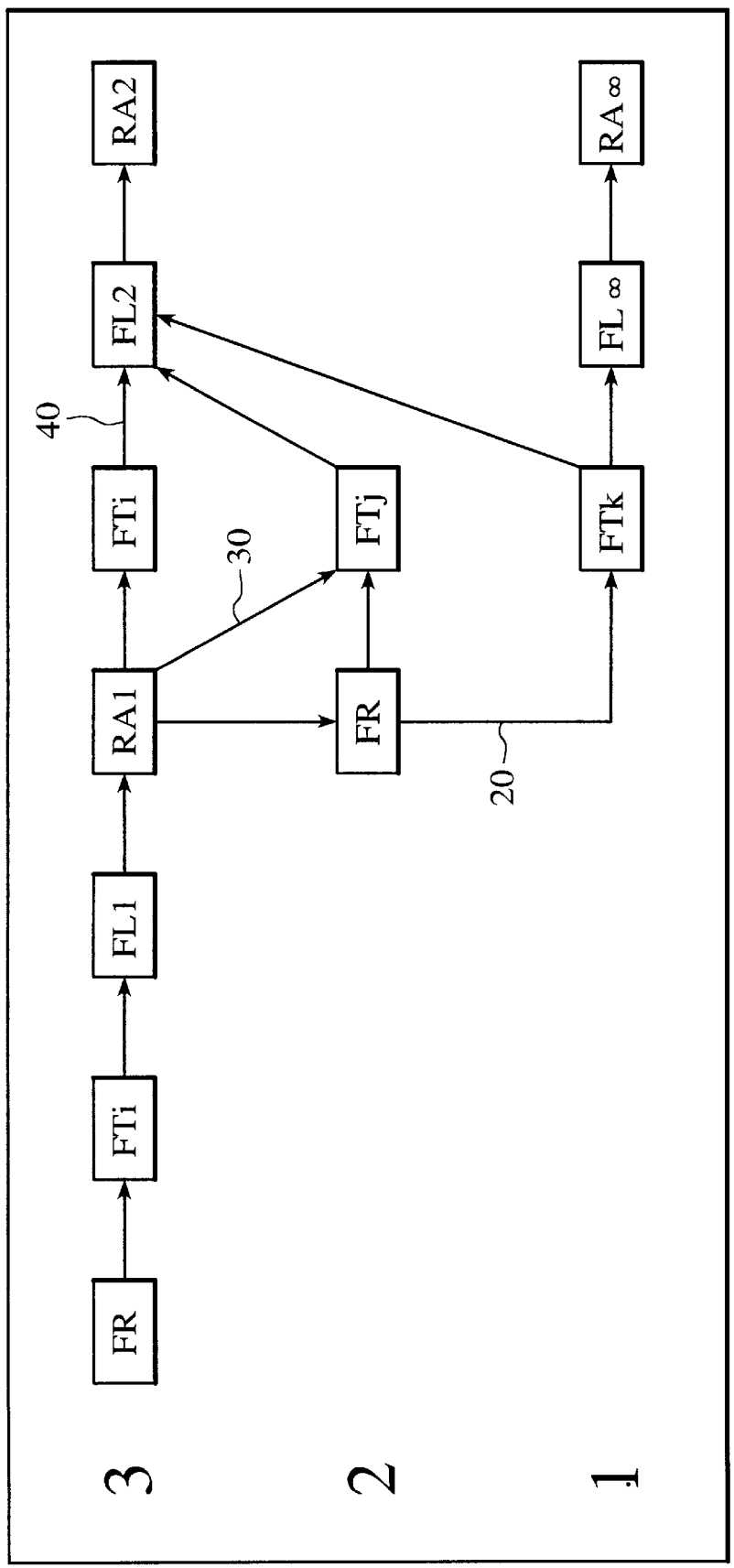
FIG. 1 is a causal diagram in accordance with the present invention.

The present invention relates to an improvement in evaluating intrusive repair on a plurality of devices. The following description is presented to enable one of ordinary skill in the art to make and use the illustrative embodiment and is provided in the context of a patent application and its requirements. Various modifications to the illustrative embodiment will be readily apparent to those skilled in the art and the generic principles herein may be applied to other embodiments. Thus, the illustrative embodiment is not intended to be limited to the embodiment shown but is to be accorded the widest scope consistent with the principles and features described herein.

The present invention discloses a system and method to evaluate intrusive repair. This method and system is based on analyzing data from the field and drawing causal diagrams (cause-consequence diagrams).

In the present invention, two measures are defined to evaluate intrusive repair—intrusivability and one-fixability. Intrusivability is defined as the probability that a repair action will cause a new fault. One-fixability is defined as the probability that the diagnostic process will fix the fault on the first repair attempt. Both of these measures are determined by using the causal diagram in accordance with the present invention.

Another important principle of the present invention is the choice of a threshold time window to analyze the effect of multiple repair actions. The time window is a period within which first and second repair actions should occur for a unique system for it to be considered as an intrusive repair or bad diagnostic process event. As the time window is increased, the probability of a second failure of a machine in that time window due to normal failure rate driven faults increases. This reduces the visibility of effects of intrusiveness and undiagnosability. On the other hand, if the time window is very small, not enough data can be collected. Also, this time window should be much smaller than the Mean Time Between Failure (MTBF) of the machine.

To obtain intrusivability and one-fixability, repair data needs to be collected for a time period equal to the threshold time window. Accordingly, the threshold time window can be obtained heuristically by trend analysis and through evaluation based on actual experience, such as discussions with field personnel familiar with the devices.

The exact determination of specific faults that cause failures is complex. It is more realistic to identify fault classes. As an example, faults related to the supply can be categorized as one fault class. In a second example, memory faults may be another fault class and finally in a third example software faults may be another fault class. It is desirable to determine fault classes for the class of devices to be characterized. The present invention utilizes advantageously conventional error log analysis techniques for fault class identification.

Accordingly, a system and method in accordance with the present invention provides a way to characterize intrusive repair and diagnostic effectiveness.

To more fully describe the present invention, refer now to the following description in conjunction with the accompanying figures.

INTRUSIVE REPAIR CASUAL DIAGRAM

The system and method for evaluating intrusive repair is based on analyzing data from the field and drawing causal diagrams (cause-consequence diagrams) to determine the probability of intrusive repair and inadequate diagnostics. The sum of these two probabilities is the probability of multiple repair actions for one actual fault (failure rate driven). The causal diagram for analyzing the effect of intrusive repair and inadequate diagnostics is shown in FIG. 1. As is seen, the first fault ($FT_i$) a system experiences in a time window is assumed to be dependent on the failure rate of the component (FR). The first fault (type i) causes the first failure ($FL_1$) which causes the first repair action ($RA_1$).

The repair action can be successful leading to the path 20 between $RA_1$ and $RA_{oo}$ (link 1). In this case, the second fault will also be failure rate driven the second repair action will occur at a time much greater than the observation window. On the other hand, the repair action can be unsuccessful. This can be due to inadequate diagnostics or intrusive repair. Intrusive repair will most likely cause a new fault ($FT_j$) in the observation time window leading to a first path 30 between $RA_1$ and $RA_2$ (link 2). Inadequate diagnostics will most likely cause the same fault ($FT_i$) to occur again in the observation time window and to a second path 40 between $RA_1$ and $RA_2$ (link 3).

The data obtained from the field is used to complete the link values for this causal diagram. The sum of the probabilities associated with links 1, 2, and 3 is one. This causal diagram is the central basis of the intrusive repair evaluation. The measures for intrusive repair evaluation are the probabilities associated with links 1, 2, and 3 in FIG. 1.

EVALUATING INTRUSIVE REPAIR

As before-mentioned, intrusive repair is evaluated using the causal diagram in FIG. 1. From the causal diagram the probability of intrusive repair and the probability of fixing the problem on the first try can be found. Based on the causal diagram, two measures are defined. Intrusivability, as before mentioned, is defined as the probability that a repair action will cause a new fault (intrusive repair). It can be measured as probability associated with link 2 $P_{intrpr}$ in the causal diagram.

One-fixability, as before mentioned, is defined as the probability that the diagnostic process will fix the fault on the first repair attempt. What is meant by diagnostic process is all aspects associated with determining what actions to take, or what part to replace in order to correct a failure. This includes, service personnel training, service documentation, service support, diagnostic programs, error data collection systems, and exposure to transient and intermittent failures. It can be measured as $1 - P_{nofix}$ where $P_{nofix}$ is the probability associated with link 3 in the causal diagram.

As before mentioned, another important principle in the present invention is the choice of a time window to analyze the effect of multiple repair actions (unsuccessful repair). The time window is a period within which repair actions 1 and 2 ($RA_1$, $RA_2$) should occur for a unique system (same serial number) for it to be considered as an intrusive repair or bad diagnostic process event. As the time window is increased the probability of a second failure of a machine in that time window due to normal failure rate driven faults increases. This reduces the visibility of effects of intrusiveness and undiagnosability on second failures, because the data includes a lot of machines whose second failure is caused due to a normal failure rate driven fault.

On the other hand, if the time window is very small not enough data can be collected to warrant statistical confidence. Also, the time window should be much smaller than the Mean Time Between Failure (MTBF) of machine components.

The trend of the change in the three path probabilities (Links 1, 2, and 3) is analyzed with the increase in the time window. Using this analysis a threshold time window is chosen to fill the link values in the causal diagram and find the intrusivability and one-fixability of a class of systems. In one example, the threshold time window (for a class of computers such as a RISC system/6000) is chosen to be seven days by doing the above analysis and by talking to field personnel.

It has also been determined that the exact determination of specific faults ($FT_i$, $FT_j$) that cause failures is complex. It is more realistic to identify fault classes for specific faults. As an example, faults related to memory can be categorized as one fault class and faults related to the power supply can be categorized as another fault class. As a result, $FT_i$ and $FT_j$ represent fault classes, not specific faults. This is the most effective way to feasibly evaluate intrusive repair. The assignment of fault classes to the specific faults leading to repair actions is crucial in determining the intrusivability and one-fixability measures. In one example, the determination of fault classes is done by using conventional error log analysis techniques developed previously. The fault classes defined using RISC System/6000 clients and servers are: (1) CPU Faults, (2) Memory Faults, (3) Power Supply faults, (4) Software Faults, and (5) I/O Faults.

To obtain intrusivability and one-fixability measures failure data records can be extracted for any seven day period. A failure data record 100 is shown in FIG. 2 (this record is a hypothetical record used for illustration purposes only). The most important fields in this record are MACHINE ID, FAILURE DAY, and FAILURE CAUSE. The failure cause is one of the five fault classes defined above. The FAILURE DAY is when the failure occurred. In most cases the REPAIR DAY and the FAILURE DAY are the same. The MACHINE ID identifies a unique machine name which is important in evaluating intrusive repair.

Following the data extraction, the machines experiencing failures in this time window are categorized based on the number of failures they experienced. Finally, the failure cause field in the failure data record is used to fill the links in the causal diagram.

EVALUATION OF INTRUSIVABILITY AND ONE-FIXABILITY

Intrusive repair negatively impacts warranty costs. A high intrusive repair factor provides justification for better maintainability design and better repair-person education. For example, an intrusivability measure of more than 0.10 in our context is a warning signal for further analysis of data. If sufficient evidence of high warranty costs due to intrusive repair can be obtained, better maintainability design and better repair person education must be provided.

Diagnostic ineffectiveness negatively impacts warranty costs. A low one-fixability factor provides justification for better diagnostic measures. A one-fixability measure of less than 0.90 in our context is a warning signal for further analysis of data. If sufficient evidence of high warranty costs due to diagnostic ineffectiveness can be obtained, better diagnostic measures must be provided. Also, if warranty cost must be reduced, reducing intrusivability and increasing one-fixability regardless of their original values will help significantly. An Example utilizing the causal diagram is described below in conjunction with the accompanying figures.

An analysis of RISC System/6000 clients and servers is used here as an example. Care is taken to include all classes of systems. The workstations evaluated, therefore, included representatives from the desktop, deskside, and rack families. Field data is retrieved on all repair actions (or failures) from field databases. For a specific time window all the repair actions are recorded. Each repair action is stored as a record in the database (FIG. 2). Each record has some key variables which are utilized to construct the causal diagram and estimate intrusivability and one-fixability. The important variables as mentioned before are the FAILURE DAY, the FAILURE CAUSE, and the MACHINE ID. These numbers shown in this section are hypothetical and are used only to demonstrate the methodology.

Intrusive repair measures for a sample of machines are dependent on the number of trials. Intrusivability and one-fixability for a sample of machines (m size) is the mean of these factors obtained for n trials. For our analysis m=5000, and n=1000.

Figure 3:
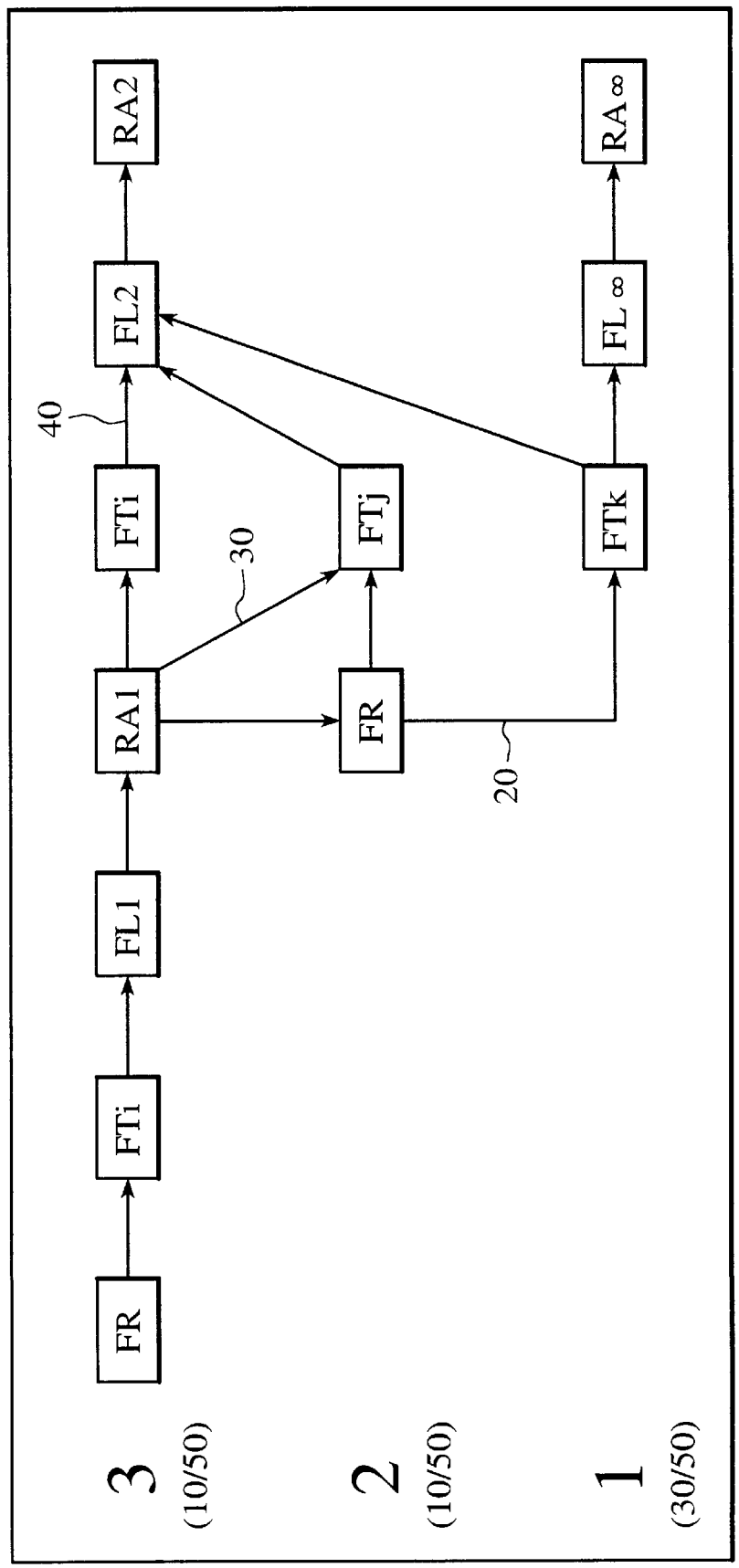
FIG. 3 is the causal diagram of FIG. 1 based upon the failure data record of FIG. 4.

In this example, each trial is a 7 day period (e.g. Jun. 20, 1996–Jun. 26, 1996). This 7 day period is the threshold time window chosen. As mentioned before, the time window is chosen by analyzing field data and talking to field personnel. In this time window, all the repair action records are extracted, and the links 1, 2, and 3 in the causal diagram are filled. FIG. 3 shows the causal diagram with the links filled for one trial.

The links in this causal diagram are filled using the repair action data obtained for this trial. This data is shown in FIG. 4. For this trial the total of repair actions (or failures) is 30*1+10*2+5*3=65. However, the total sample space is only 50. This is because 30 machines do not experience the second failure in this time window, 10 machines experience subsequent failures in this time window, and 5 machines experience two subsequent failures twice in this time window. As a result, the total sample space is 30+10+5*2=50.

Now the probability associated with link 1 in the causal diagram Pr(1)=30/50. This is because 30 machines experienced only one failure in this time window. As a result, these machines will experience the event FL__ in a future time window. The probability associated with link 2 Pr(2)=10/50. This is obtained from the trial record by totalling all the two-failure events in this time window whose failures (FTi, FTj) are not the same. An example is (I III) in TWO-FAIL event. Also, (IV II I) in THREE-FAIL event counts as two two-failure events whose failure causes are not the same. The probability associated with link 3 Pr(3)=10/50. This is obtained from the trial record by totalling all the two-failure events in this time window whose failures causes (FTi, FTi) are the same. An example is (I I) in TWO-FAIL event. Also, (IV IV II) in THREE-FAIL event counts as only one (IV IV) two-failure event whose failure causes are the same. The event (IV II) is counted towards link 2.

From the causal diagram in FIG. 3, it can be inferred that for this trial:

Intrusivability=10/50=0.20
One-Fixability=1−10/50=0.80

We ran a total of 1000 trials for each class of machines and the results are shown in Table 1 of FIG. 5.

Based on these results it can be seen that action is required to reduce intrusivability and increase one-fixability for machine classes 3XX and 3ZZ. These indicators provide the justification for better maintainability design and for better diagnostics. However, before specific action is taken further quantitative and qualitative analysis might be necessary.

Although the system and method has been described in accordance with the embodiments shown, one of ordinary skill in the art will readily recognize that there could be variations to the embodiments and those variations would be within the spirit and scope of the above-described system and method. For example, although the evaluation of intrusive repair is described in terms of computer systems, one of ordinary skill in the art readily recognizes that this system could be utilized in conjunction with many types of devices including, but not limited to, automobiles, radios, televisions, clocks, or other types of machinery and its use would be within the spirit and scope of the present invention. In addition, one of ordinary skill in the art readily recognizes that the threshold time window, although in the specific example is seven days could be of any length, depending on the characteristics of a particular class of devices. Accordingly, many modifications may be made by one of ordinary skill in the art without departing from the spirit and scope of the appended claims.

What is claimed is:

1. A method for evaluating intrusive repair for a class of devices comprising the steps of:
   providing a threshold time window for analyzing failure data; and
   utilizing a causal diagram based on the analysis of the failure data for the class of devices to indicate the probability of intrusive repair determined by a measurement of intrusivability and one-fixability.

2. The method of claim 1 in which the failure data is categorized as classes of faults which are identified utilizing error log analysis techniques.

3. The method of claim 2 in which classes of devices comprise computer processing systems.

4. The method of claim 3 in which classes of faults comprise CPU faults, memory faults, power supply faults, software faults and I/O faults.

5. The method of claim 1 in which the causal diagram comprises:
   first path wherein a device after a first fault is repaired requires no further repair action;
   a second path wherein the device after a first fault is repaired encounters a first type of fault, the first type of fault being different than the first fault (second fault); and
   a third path wherein the device after the first fault is repaired encounters a second type of fault, the second type of fault being the same as the first fault (second fault).

6. The method of claim 5 in which the first type of fault comprises an indication of intrusive repair.

7. The method of claim 5 in which the second type of fault comprises an indication of inadequate diagnostics.

8. The method of claim 1 wherein the intrusivability comprises the probability that a repair action will cause a new fault.

9. The method of claim 8 wherein an intrusivability probability of more than 0.10 is a warning for further analysis of data.

10. The method of claim 1 wherein the one-fixability comprises the probability that a diagnostic process will fix the fault on the first repair attempt.

11. The method of claim 10 wherein a one-fixability probability of less than 0.90 is a warning for further analysis of data.

12. A system for evaluating intrusive repair for a class of devices comprising:

means for providing a threshold time window for analyzing failure data: and means for utilizing a causal diagram based on the analysis of the failure data for the class of devices to indicate the probability of intrusive repair determined by a measurement of intrusivability and one-fixability.

13. The system of claim 12 in which the failure data is categorized as classes of faults which are identified utilizing error log analysis techniques.

14. The system of claim 13 in which classes of devices comprise computer processing systems.

15. The system of claim 14 in which classes of faults comprise CPU faults, memory faults, power supply faults, software faults and I/O faults.

16. The system of claim 12 in which the causal diagram comprises:

first path wherein a device after a first fault is repaired requires no further repair action;

a second path wherein the device after a first fault is repaired encounters a first type of fault, the first type of fault being different than the first fault (second fault); and a third path wherein the device after the first fault is repaired encounters a second type of fault, the second type of fault being the same as the first fault (second fault).

17. The system of claim 16 in which the first type of fault comprises an indication of intrusive repair.

18. The system of claim 16 in which the second type of fault comprises an indication of inadequate diagnostics.

19. The system of claim 12 wherein the intrusivability comprises the probability that a repair action will cause a new fault.

20. The system of claim 12 wherein the one-fixability comprises the probability that a diagnostic process will fix the fault on the first repair attempt.

21. The system of claim 19 wherein an intrusivability probability of more than 0.10 is a warning for further analysis of data.

22. The system of claim 20 wherein a one-fixability probability of less than 0.9 is a warning for further analysis of data.

* * * * *